United States Patent [19]

Bernardi

[11] 4,193,834
[45] Mar. 18, 1980

[54] AUTOMATIC TAPING MACHINE

[75] Inventor: Carl E. Bernardi, San Jose, Calif.

[73] Assignee: National Semiconductor Corporation, Santa Clara, Calif.

[21] Appl. No.: 897,685

[22] Filed: Apr. 19, 1978

[51] Int. Cl.² .................. B32B 31/00; G03B 1/22
[52] U.S. Cl. ........................... 156/521; 226/67
[58] Field of Search .............. 156/519, 520, 521; 226/67

[56] References Cited

U.S. PATENT DOCUMENTS

| | | | |
|---|---|---|---|
| 1,318,108 | 10/1919 | Ray | 226/67 |
| 1,909,841 | 5/1933 | Perryman . | |
| 2,112,419 | 3/1938 | Krause . | |
| 2,683,401 | 7/1954 | Smith | 93/1 |
| 2,865,261 | 12/1958 | Seragnoli | 156/520 |
| 2,866,638 | 12/1958 | Mannisto | 226/67 |
| 3,190,784 | 6/1965 | Heydon | 156/513 |
| 3,232,804 | 2/1966 | Klopfenstein | 156/60 |
| 3,477,627 | 11/1969 | Webers | 226/67 |
| 3,517,438 | 6/1970 | Johnson | 29/627 |
| 3,537,175 | 11/1970 | St. Clair | 29/624 |
| 3,559,285 | 2/1971 | Kauffman | 29/630 |
| 3,707,420 | 12/1972 | Young | 156/314 |
| 3,762,623 | 10/1973 | Brunner | 228/3 |
| 3,847,710 | 11/1974 | Blomqvist | 156/511 |
| 3,898,122 | 8/1975 | Hawkins | 156/510 |
| 3,923,579 | 12/1975 | Califano | 156/263 |
| 3,960,646 | 6/1976 | Wiedamann | 156/518 |
| 4,025,380 | 5/1977 | Bernardo | 156/355 |

Primary Examiner—Douglas J. Drummond
Attorney, Agent, or Firm—Brown & Martin

[57] ABSTRACT

An automatic taping machine for automatically applying tapes to lead frames includes a lead frame feeding mechanism and a tape feeding mechanism with an automatic cutter and applying mechanism for automatically cutting and applying strips of tape to the lead frame. The cutting mechanism is adapted to eliminate the waste in tape and utilizes the entire roll of tape fed to it and includes feeders for feeding tape from both sides to a double cutter head which cuts strips of tape across the entire width of the tapes and includes a vacuum holder for holding the tape to a face of the cutter head for then applying the tape to the lead frames. The frames are advanced through the mechanism and the tapes applied and then fed through a heating press for heating the tape and securing it in place on the lead frames.

21 Claims, 16 Drawing Figures

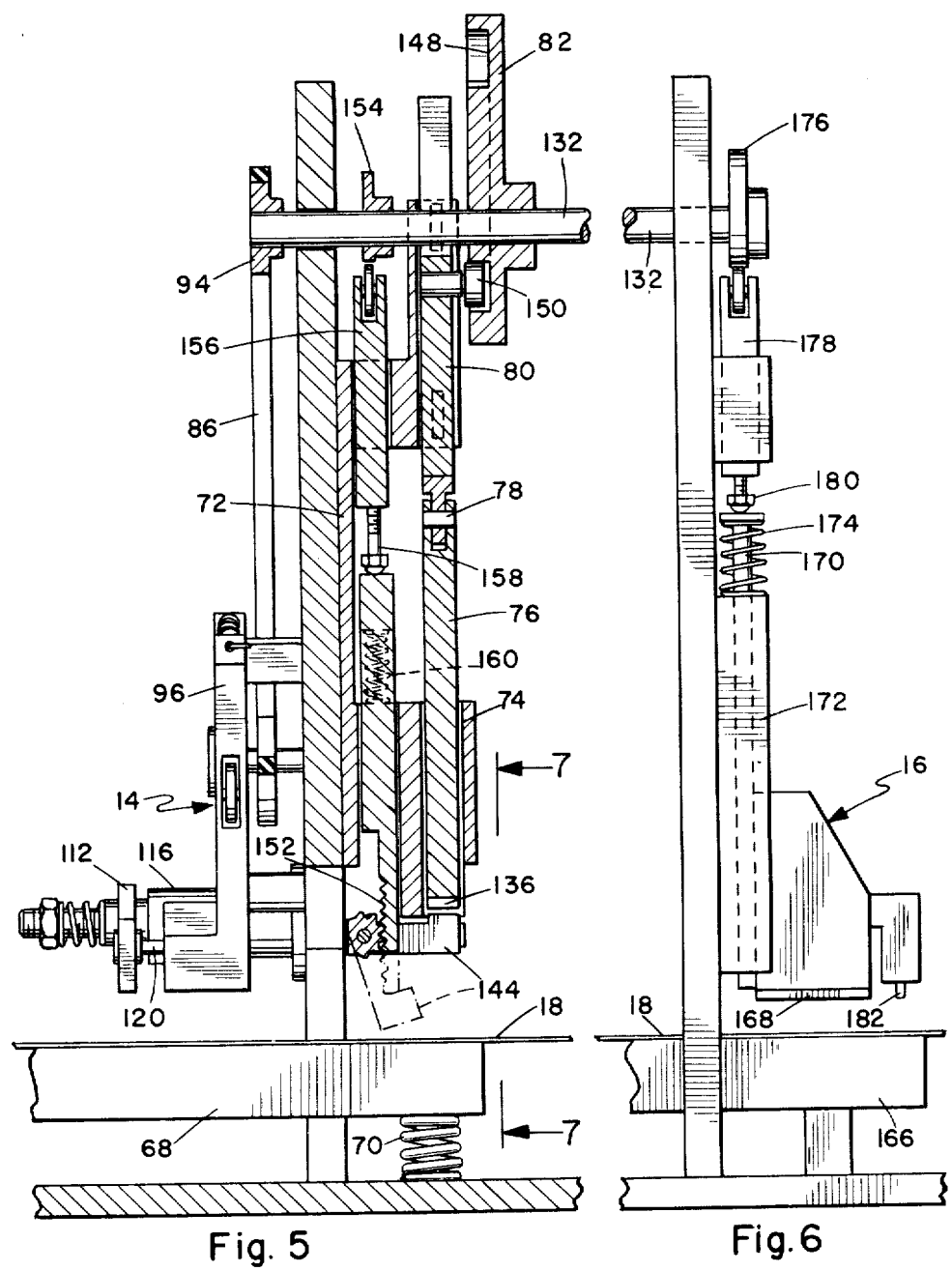

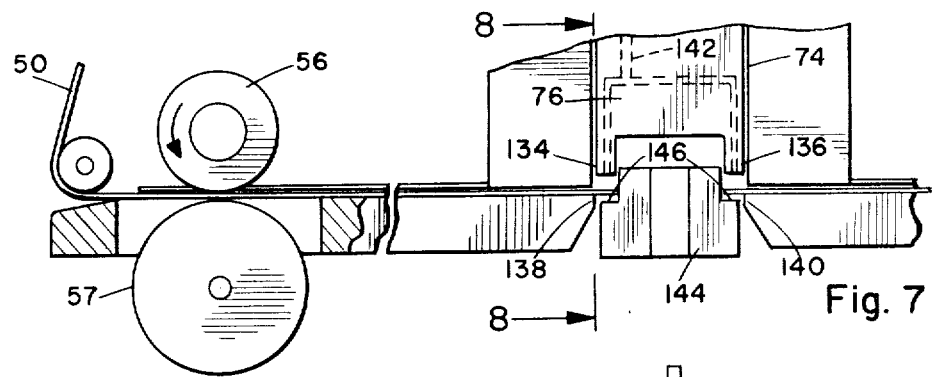
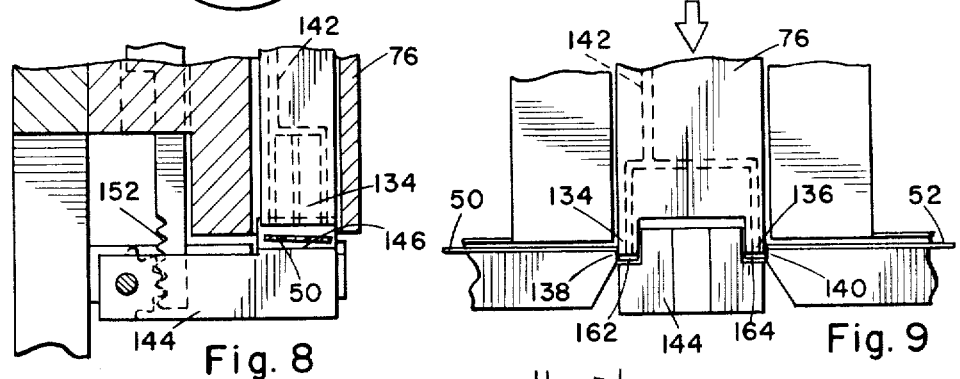
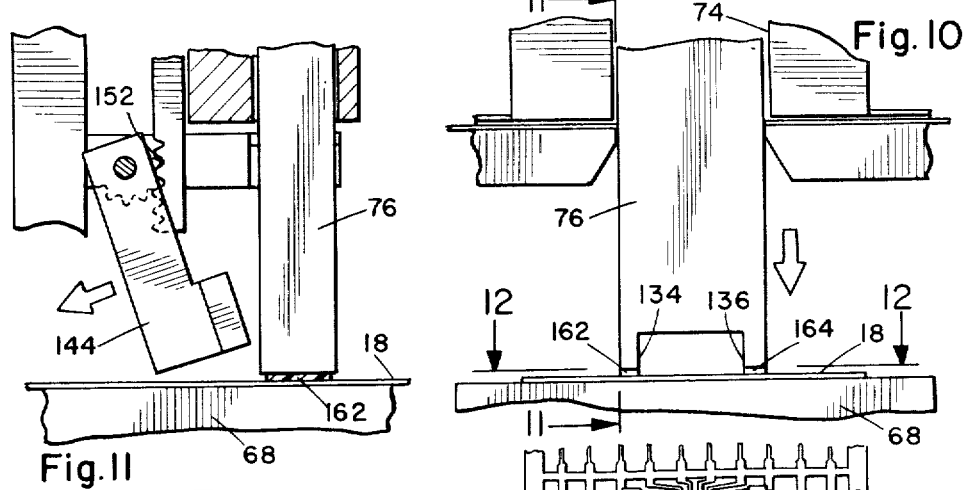
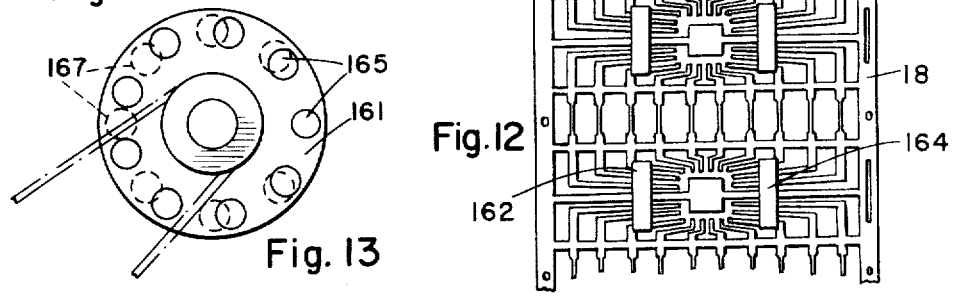

AUTOMATIC TAPING MACHINE

BACKGROUND OF THE INVENTION

The present invention relates to taping machines and pertains particularly to a machine for automatically cutting and applying a tape to the leads of lead frames for semiconductor packages.

Lead frames are utilized in the semiconductor industry for connecting semiconductor devices inside a package to a plurality of connecting pins externally of the semiconductor package. As the number of leads in the frame increase, the leads become smaller and thus it becomes necessary to secure the leads in some manner for processing of the lead frames. The long thin leads of multiple lead frames become quite flexible and are easily bent and damaged during processing if not properly secured. One manner of securing the leads together during processing or for processing is the use of a polyamide tape. Small strips of such polyamide tape is applied to the fingers of the frame to mechanically support the leads during the processing.

The prior art technique for applying such tapes to a lead frame includes the use of a ladder type tape with strips extending transverse between side rails with alternate ones of the strips cut out and applied to the leads by a machine. While this process can be automatic and can be quite rapid, it utilizes only approximately ⅓ of the tape. Such tape is quite expensive and such waste increases the expense of processing lead frames.

It is therefore desirable that some means be available for rapidly and conveniently applying tape without waste to lead frames.

SUMMARY AND OBJECTS OF THE INVENTION

It is accordingly the primary object of the present invention to overcome the above problems of the prior art.

Another object of the present invention is to provide a tape machine for automatically applying strips of tape to a lead frame without waste of the tape.

A further object of the present invention is to provide an automatic tape applying machine that cuts strips from a solid tape and applies the strips to a lead frame.

In accordance with the primary aspect of the present invention, a machine for applying tapes to a lead frame includes feeding means for feeding the lead frames through the machine and feeding means for feeding separate rolls of tape to a double cutting head which automatically cuts and applies two strips of the tape to the lead frame.

BRIEF DESCRIPTION OF THE DRAWINGS

The above and other objects and advantages of the present invention will become apparent from the following description when read in conjunction with the drawings, wherein:

FIG. 5 is a further enlarged sectional view taken on line 5—5 of FIG. 3.

FIG. 6 is an enlarged front elevational view of the tape pressing mechanism positioned to align with FIG. 5.

FIG. 7 is a view taken in the direction of arrows 7—7 of FIG. 5.

FIG. 8 is a sectional view taken on line 8—8 of FIG. 7.

FIG. 9 is a view similar to FIG. 7, showing the tape cutting action.

FIG. 10 is a view similar to FIG. 9 showing the action of applying the cut tapes to the lead frame.

FIG. 11 is a sectional view taken on line 11—11 of FIG. 10.

FIG. 12 is a top plan view of a pair of lead frames with the tapes applied, as viewed in the direction of arrows 12—12 of FIG. 10.

FIG. 13 is an enlarged sectional view taken on line 13—13 of FIG. 2.

DETAILED DESCRIPTION OF THE PREFERRED EMBODIMENT

Figure 1:
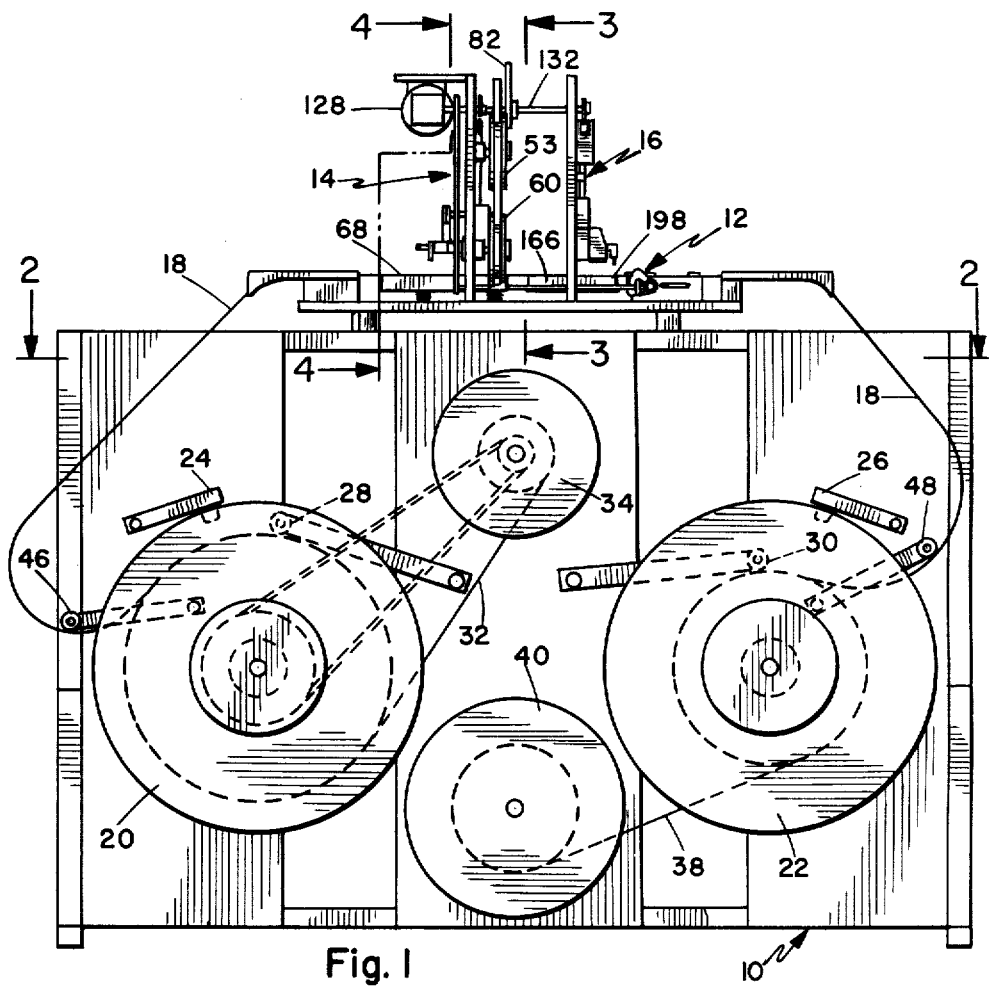
FIG. 1 is a front elevational view of the complete machine.

Turning to FIG. 1 of the drawing, there is illustrated a machine in accordance with the present invention. This machine includes generally a support frame 10 extending generally upward and including a lead frame advancing mechanism at 12, a tape cutting and applying mechanism designated generally by the numeral 14, and a pressure and heating mechanism designated generally by the numeral 16. These individual mechanisms will be described in more detail later. The machine in general feeds continuous strips of lead frames 18 from a first reel 20 through the tape applying mechanism and back onto a reel at 22. The lead frames are, for example, formed on a continuous strip of sheet metal or the like somewhat similar to that shown, for example, in U.S. Pat. No. 3,537,175, issued Nov. 3, 1970 to St. Clair et al.

The lead frame reels 20 and 22 are typically constructed of cardboard and therefore a spreader mechanism 24 and 26 is provided for each reel to prevent damage to the edge of the frame. Each reel is provided also with a pinch roller 28 and 30 for applying pressure to prevent the lead frame from slipping on the reels. The coils of lead frame on each of the reels is separated by means of thin strips of paper 32 which is unwound from reel 20 onto a paper reel 34. Similar paper 38 is wound from a reel 40 onto the coils of lead frame on reel 22 for separating the respective coils.

The supply reel 20 and take up reel 22 are each driven by separate motors 42 and 44 which are each respectively on and off by electrical switches controlled by loop control arms 46 and 48.

Figure 3:
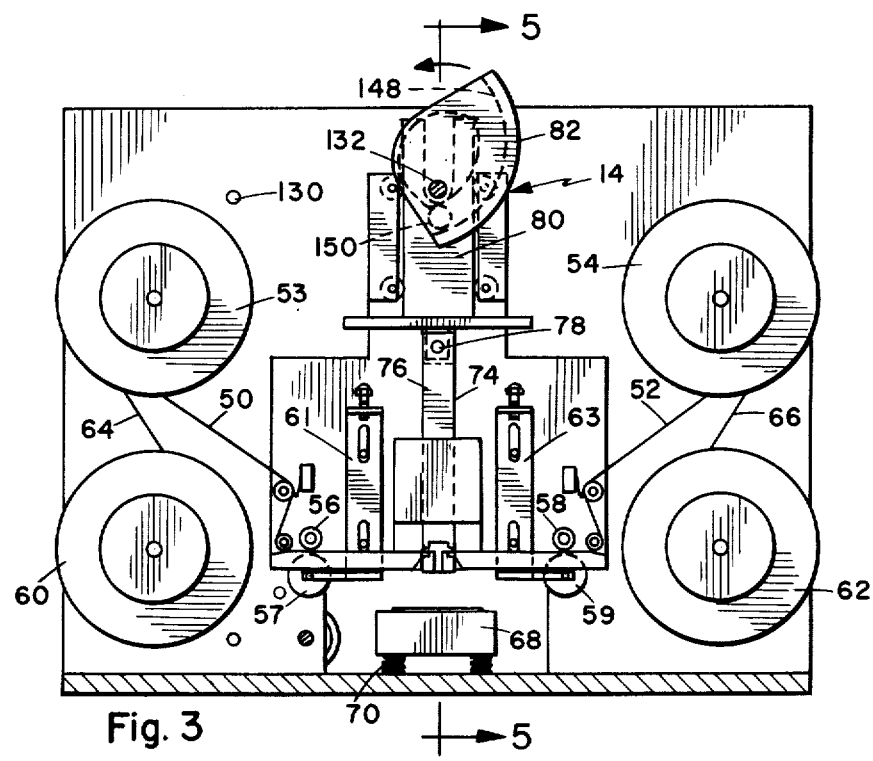
FIG. 3 is an enlarged sectional view taken on line 3—3 of FIG. 1.

Turning now to FIG. 3 of the drawings, the tape cutter and placement mechanism is illustrated. As best seen in FIG. 3, the tape cutting and placement or applying mechanism includes means for taking tape 50 and 52 from separate reels 53 and 54 to each side of the cutting and applying head and feeding it by means of feeding or capstan drive rollers 56 and 58 into the tape cutting and applying head. Separate reels 60 and 62 wind continuous strips of Mylar backing 64 and 66 from the polyamide tapes 50 and 52. The two separate tapes 50 and 52 are continuously fed into the cutting head where separate pairs of strips are simultaneously cut from the separate tapes and applied to the lead frame which is fed across a support block 68 which is resiliently supported on suitable resilient means such as springs 70.

The tape drive rollers 56 and 58 are driven intermittantly by a one way clutch arrangement as will be described. These rollers engage the tape between the respective capstan drive rollers and pinch rollers 57 and 59. The pinch rollers 57 and 59 are mounted on slide blocks 61 and 63 which are adjustable with respect to the cutter frame 72. The cutter assembly includes a frame 72 having a slide channel 74 in which is mounted a cutting bar 76 for reciprocation toward and away from the low temperature heater and support block 68. The lower end of the cutter bar 76 includes cutting edges and placement faces as will be described later. The upper end of the cutter bar is connected by a pin 78 to a vertically reciprocating drive block 80 which is driven by a cutter cam 82.

Figure 4:
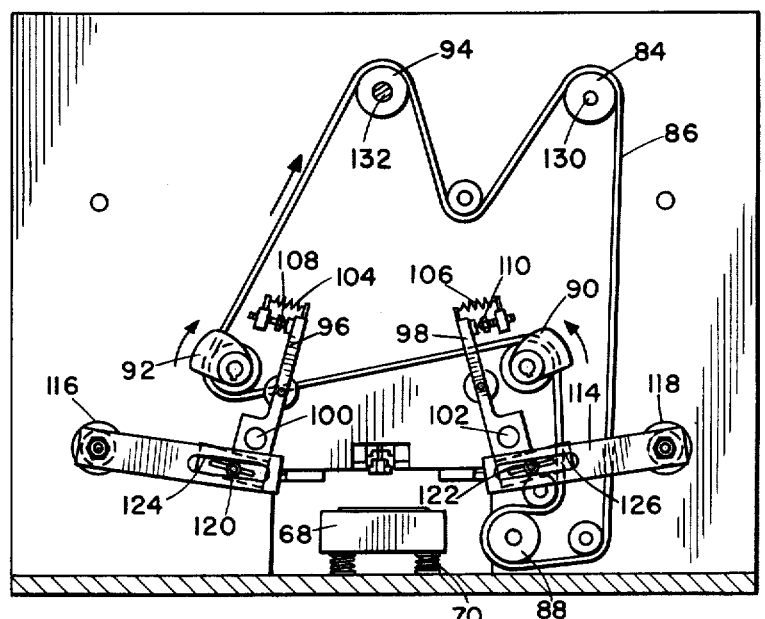
FIG. 4 is an enlarged sectional view taken on line 4—4 of FIG. 1.
Figure 14:
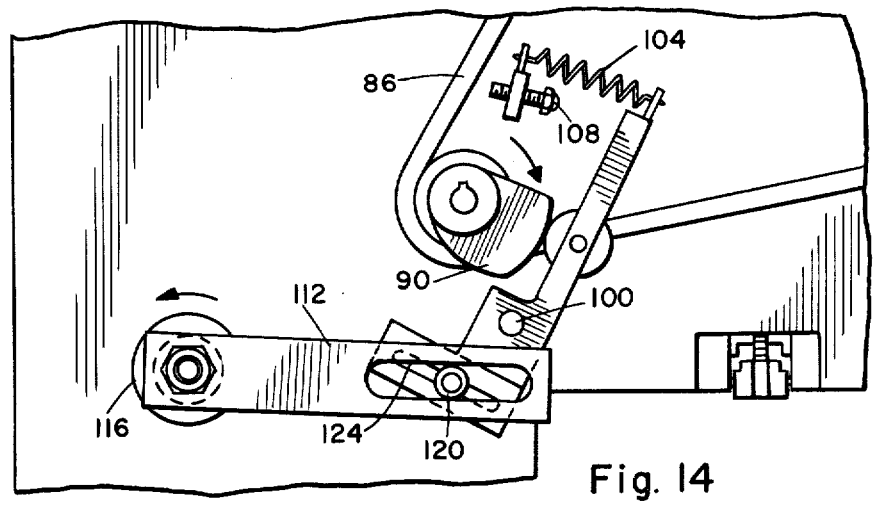
FIG. 14 is an enlarged view of a portion of FIG. 4, showing the incremental tape advance mechanism.

The main drive of the system is shown in FIG. 4, wherein a motor sprocket 84 driven by a suitable electric motor drives a chain 86 which in turn drives an indexer drive sprocket 88, capstan drive cams 90 and 92, and cutter sprocket 94 which drives a shaft on which the cam 82 is mounted. The capstan drive includes a drive or actuator bars 96 and 98 which are connected to shafts 100 and 102, which in turn are connected by conventional one way clutches to the capstan drive rollers 56 and 58. Oscillation of the arms 96 and 98 by means of cams 90 and 92 drive the capstan drive rollers 56 and 58. The arrangement is such that the actuator bars 96 and 98 drive the respective capstan drive sprockets by means of springs 104 and 106, when pulled by the spring back to its stop position. The actuator bars are forced outward by the cams 90 and 92 at which point the one way clutch is engaged and the bar is pulled back by springs 104 and 106. The drive sprockets 56 and 58 are advanced an amount determined by the stop adjustment screws 108 and 110. Thus, the stroke of the actuator bars, which determine the length of the tape drive step, is independent of the cams 90 and 92 but dependent upon the adjustment 108 and 110.

The Mylar take up reels 60 and 62 are driven by drive arms 112 and 114 which are connected by one way clutches 116 and 118 to the drive shaft of the take up reels. The drive arms 112 and 114 are driven by pins 120 and 122 which engage slots 124 and 126 in the arms 112 and 114. The pins 120 and 122 are adjustably mounted on the drive bars 96 and 98 such that the stroke of the drive arms 112 and 114 is adjustable.

Turning now to FIGS. 5 and 6 of the drawings, the details of the cutter mechanism are best seen. As seen in FIG. 5, the cutter assembly includes a drive motor 128 which drives a shaft 130 on which motor drive sprocket 84 is mounted. The cutter drive sprocket 94 is directly behind sprocket 84 and drives a drive shaft 132 for driving a series of cams for the cutting operation.

The cutting bar 76 is provided with a pair of cutting and placing heads 134 and 136 as best seen in FIG. 7. These cutting and placing heads are formed by a generally inverted U-shaped configuration of the lower end of the cutting bar. The cutting portion is defined by the corner edges of the cutting edges cooperating with fixed or stationary cutting edges 138 and 140. The cutting and placing head also includes grasping means in the form of a plurality of vacuum ports communicating at each of the faces 134 and 136 and communicating with a vacuum passage 142 in the cutting bar. This passage communicates with a manifold to a source of vacuum, the communication of which is controlled and timed with the movement of the cutting bar to grasp strips of the tape after cutting and retaining them until placed on a lead frame.

A cutting gate 144 is disposed below the cutting head and cooperates therewith to hold strips to cut tape until grasped by the cutting and placing head. This gate, as seen in FIGS. 7 and 8, includes strip support shelves 146 for supporting the strips of tape as shown in FIG. 9 until grasped by the vacuum means in the placing head.

The cutting bar 76 is actuated by means of a cam 82 driven by shaft 132. The cam 82 includes a cam slot 148 in which a follower 150 rides. The follower 150 is connected to the actuating block 80 and drives the block 80 in a vertical oscillating motion.

The cutting gate 144 is pivotally mounted on the cutter frame and is driven by a rack and pinion assembly 152 into and out of position below the cutting head. The rack and pinion assembly 152 is driven by a cam 154 mounted on shaft 132, driving a follower block 156 which adjustably engages the rack 152 by means of an adjustable screw or the like 158. This permits the stroke or positioning of the gate to be adjusted. A spring 160 retracts the gate 144 into its normal position below the cutter head.

The cutter head and cutter gate are thus sequenced and timed to function together as shown in sequence in FIGS. 7 through 10, to cut and simultaneously apply to separate strips 162 and 164 to a lead frame. As shown in FIG. 7, for example, the cutter bar 76 is in the retracted position with the cutting and placing heads 134 and 136 above the stationary cutting heads 138 and 140. The strips of tape 50 and 52 are advanced such that a portion thereof extends beyond the cutter heads 134 and 136 above the platforms 146. The movable cutter heads then move downward engaging the tape which is preferably fed in at a slight angle of approximately 1° or so, as shown in FIG. 8, to facilitate cutting. As the movable cutter head passes the stationary cutter heads, the strips of tape 162 and 164 are cut off as shown in FIG. 9, and grasped by the vacuum ports in the placing heads 134 and 136. At this point the cutter gate 144 is timed to swing downward out of the way as shown in FIG. 11, permitting the cutter and placing heads to move downward as shown in FIG. 11 against the lead frame 18 for placement of the two strips 162, 164 on the lead frames as shown in FIG. 12. As the cutter bar and head is retracted upward on the return stroke the lead frames are then advanced another frame and the tapes 50 and 52 are also advanced another step for the next stroke or sequence of cutting and placing of the strips of tape on the lead frames.

Figure 2:
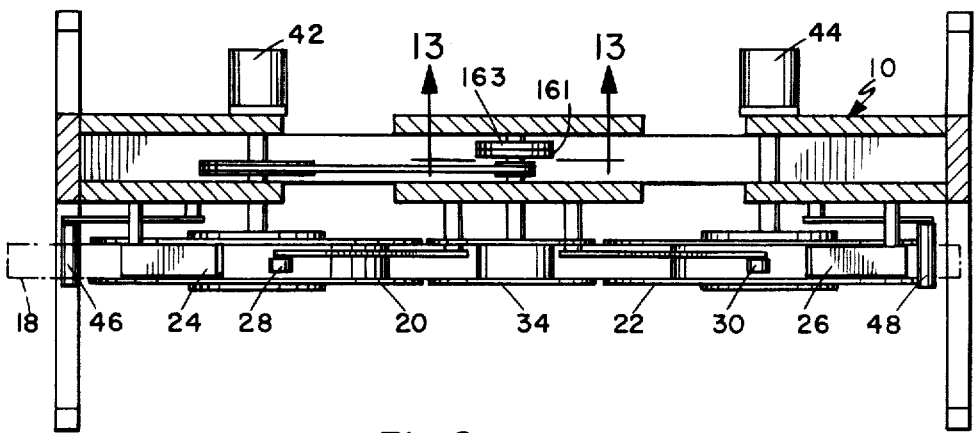
FIG. 2 is a sectional view taken on line 2—2 of FIG. 1.

The paper take up reel 34 is driven by magnetic slip clutch as shown in FIGS. 2 and 13, which comprise a pair of side by side rotary discs 161 and 163 having a different number of confronting magnets 165 and 167 in a circle around the periphery of each disc. With this arrangement, one set of opposed magnets will be in substantial alignment and the tension on the paper reel can be sufficient to cause one disc to slip to the next magnet position, thus preventing excess tension from being placed on the strip of paper.

Turning now to FIG. 6, a high pressure press is illustrated for applying high pressure and temperature to the strips of tape on the lead frames for pressing the pieces of tape securely against the stationary high temperature heater block.

As the lead frame advances from the cutting and placing station, it advances onto a high temperature heater block. A high pressure head, which is slidably mounted for vertical reciprocation on a shaft 170 which is slidably mounted in a channel 172. The high pressure head 168 is retracted by means of a retracting spring 174 and is forced downward by means of a cam 176 secured to rotary shaft 132 engaging a cam follower 178. The positioning of the pressure pad 168 is adjustable by an adjustable screw 180 between the cam follower 178 and the slide 170. Thus, heat and pressure are applied in the high pressure press for pressing the strips of tape securely into position on the lead frame. Tape sensors 182 are provided for sensing the tapes on the lead frame and are interconnected with the control system of the machine for shutting the machine down if the tape is not stuck to the lead frame.

Figure 15:
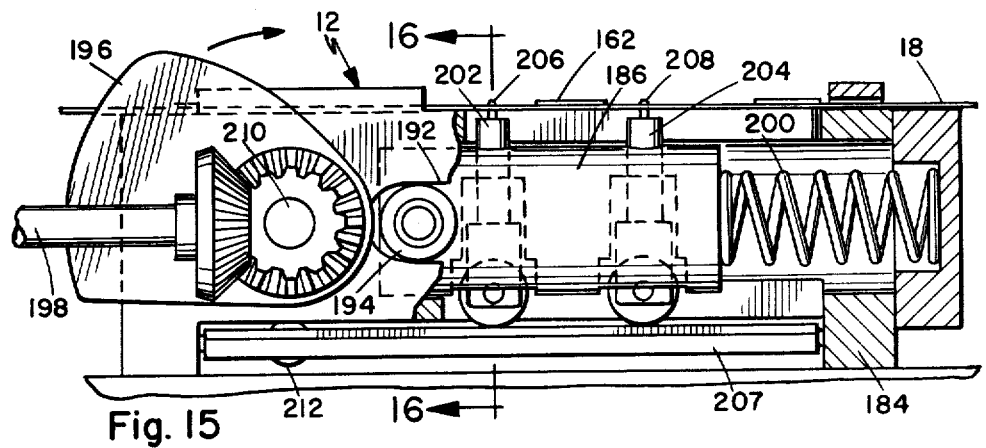
FIG. 15 is an enlarged side elevation view of the lead frame advance mechanism with portions cut away.
Figure 16:
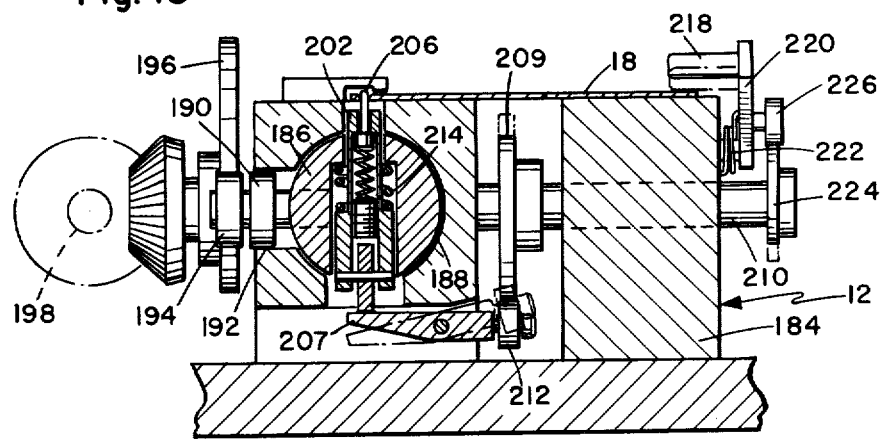
FIG. 16 is a sectional view taken on line 16—16 of FIG. 15.

Turning now to FIGS. 15 and 16 of the drawing, a lead frame indexing mechanism is shown. The mechanism comprises a housing 184 in which is mounted a carriage in the form of a cylindrical block 186 within a bore 188. The block includes a roller 190 mounted on a pin extending outward from the block and engaging a slot 192 for preventing the block from rotating. A roller cam follower 194 is engaged by a rotating drive cam 196 which is driven by a shaft 198 from the cutter assembly drive train. A retraction or return spring 200 engages the end of the block 186 to bias it backward on the return stroke. A pair of plungers 202 and 204 having pins 206 and 208 on the upper ends thereof are reciprocally mounted for vertical movement within the block 186. These pins engage apertures in the lead frame for advancing the lead frame. The plungers are moved upward by means of a tilt plate 207 which is tilted by means of a cam 209 mounted on rotary drive shaft 210 and engaging a cam follower 212 on the side of tilt plate 207. The tilt plate 207 engages rollers on the under or lower end of the respective plungers and biases the plungers upward through apertures in the lead frame. At the end of the stroke the tilt plate tilts downward to the downward position and the plungers 202 and 204 are retracted by means of the springs 214 and 216, which bias the plungers downward.

As further seen in FIG. 16, a clamping pin 218 mounted on the end of a pivotal arm 220 engages and retains the lead frame in position during retraction and return stroke of the indexing mechanism. The arm 220 is biased to the clamping position by means of a spring 222 and is released by means of a cam 224 mounted on shaft 210 and engaging a follower 226 mounted on the arm 220.

The above described indexing mechanism functions to automatically advance lead frames through the machine and automatically cut and apply strips of tape to the lead frames. In operation, the lead frame is indexed one step at a time by the indexer. The lead frame is advanced to the low temperature heat block or heat support block below the cutting and placing head. Since two strips of tape are placed on each lead frame, two separate rolls of tape are supplied to the cutting head with the tape advanced to both sides of the cutter for cutting and applying strips of tape to the lead frame. The cutter starts the downward movement and cuts off exposed pieces of tape on each side with downward travel of the cutter halted momentarily due to a dwell in the cutter cam. The cut pieces of tape fall onto the shelf on the cutter gate which supports these strips until the cutter grasping means, (i.e., the three vacuum ports in the end of each side of the cutter), grasps the strips of tape. During the dwell period of the cutter cam, the cut pieces of tape are picked off the cutter gate by the vacuum and held into position on the end of the cutter and placing head. The cutter gate is then pivoted open by a cam and write mechanism and the cutter then resumes its downward travel and presses the tape to the heated lead frame against the spring loaded low temperature heater and support block 68. Also, at the bottom of the cutter stroke, the two pinch rollers are moved downward to release their hold on the incoming tape. This is done to relieve possible skewing motion of the tape if it exists. The cutter then starts its upward movement and the pinch rollers come back onto contact with the capstan rollers which then drive the two tapes into the cutting position. At the top of the cutter stroke the new tape is fed into the cutter area and a new stroke of the cutter beings. At the same timing of the cutters downward stroke, the high pressure pad is pushed downward by its cam and presses the previously placed pieces of tape securely against the stationary high temperature heater block. Also, during the return of the stroke of the cutter and pressure pad, the indexer indexes the lead frame another station and the process continues.

While I have described my invention by means of a specific embodiment, it is to be understood that numerous changes and modifications may be made therein without departing from the spirit and scope of the invention as defined in the appended claims.

Having described my invention, I now claim:

1. An apparatus for applying a securing tape to a lead frame, said apparatus comprising:
    a support surface for supporting a lead frame;
    feeding means for feeding lead frames across said support surface;
    a tape cutting and applying assembly disposed above said support surface and including a stationary cutting block having a fixed cutting edge, tape feeding means for feeding a tape a predetermined distance beyond said cutting edge, and a vertically movable cutting head including a movable cutting edge movable past said fixed cutting edge for cutting a strip from a tape and applying said strip to lead frame on said support surface,
    said cutting head includes a pressure face extending outward from said movable cutting edge, said grasping means comprises vacuum ports in said pressure face, and
    a movable cutting gate movable into and out of a position adjacent said fixed cutting edge and including stop means for stopping said tape said predetermined distance beyond said cutting edge, and a support surface for supporting said strip of tape ahead of said cutting head until grasped by said grasping means.

2. The apparatus of claim 1, wherein the feeding means for feeding said lead frames comprises an indexing mechanism for indexing said lead frames a single frame at a time into position under said cutting head,
    said indexing means including a reciprocating carriage for engaging and advancing the lead frame.

3. The apparatus of claim 2, wherein said indexing means includes first cam means for driving said cam forward and second cam means for activating said engaging means.

4. The apparatus of claim 3, wherein said engaging means comprises pin means cammed into apertures in said lead frame prior to the advancing stroke and retracted from said lead frame prior to said return stroke.

5. An apparatus for applying a securing tape to a lead frame, said apparatus comprising:
   a support surface for supporting a lead frame;
   feeding means for feeding lead frames across said support surface comprising an indexing mechanism for indexing said lead frames a single frame at a time into position under said cutting head, including a reciprocating carriage having pin means for engaging and advancing the lead frame,
   first cam means for driving said carriage forward, and second cam means for camming said pin means into apertures in said lead frame prior to the advancing stroke and retracting said pin means from said lead frame prior to said return stroke,
   said carriage comprising a cylindrical block mounted within a bore in a housing for reciprocation therein with said first cam means for driving said cylindrical block in a forward stroke and spring means for returning said block on the return stroke, and
   a tape cutting and applying assembly disposed above said support surface and including a stationary cutting block having a fixed cutting edge, tape feeding means for feeding a tape a predetermined distance beyond said cutting edge, and a vertically movable cutting head including a movable cutting edge movable past said fixed cutting edge for cutting a strip from a tape and applying said strip to a lead frame on said support surface.

6. The apparatus of claim 5, wherein said engaging mechanism includes a tilt plate actuated by said second cam means for advancing said pin means into engagement with said apertures in said lead frame.

7. The apparatus of claim 6, including clamp means for clamping said lead frame into position at the end of each advance stroke.

8. The apparatus of claim 1, wherein said tape is fed through said apparatus transverse to the lead frames.

9. An apparatus for applying a securing tape to a lead frame, said apparatus comprising:
   a support surface for supporting a lead frame;
   feeding means for feeding lead frames across said support surface;
   a tape cutting and applying assembly disposed above said support surface and including a stationary cutting block having a fixed cutting edge, tape feeding means for feeding a tape a predetermined distance beyond said cutting edge, and a vertically movable cutting head including a movable cutting edge movable past said fixed cutting edge for cutting a strip from a tape and applying said strip to a lead frame on said support surface wherein said tape cutting assembly includes a double cutting head and said tape feeding means includes means for feeding tape transverse to the lead frames from separate rolls on opposite sides of said cutting head directly to said cutting head.

10. The apparatus of claim 12, wherein said cutting head is adapted to cut the entire width of said tape fed thereto.

11. The apparatus of claim 10, wherein said tape feeding mechanism includes intermittent feeding apparatus.

12. The apparatus of claim 11, wherein said intermittent feeding apparatus includes a capstan roller and a pinch roller for each tape and an oscillating arm connected to said feed roller by intermittent clutch means for intermittently driving said capstan roller.

13. The apparatus of claim 12, wherein said oscillating arm is driven in the drive direction by means of a spring and in the return direction by means of a cam.

14. The apparatus of claim 13, wherein said advance or oscillating arm is adjustable in stroke by means of an adjustable stop means.

15. The apparatus of claim 14, including a cutter gate disposed below said cutter head, and cutter gate operating mechanism for maintaining said gate below said cutter head until strips of tape are cut from said tapes, and thereafter operative to move said gate out of position in front of said cutter head during the downward stroke thereof.

16. The apparatus of claim 15, wherein said cutter gate and said cutter head are driven from a common motor, each driven by separate cam means in timed relationship.

17. The apparatus of claim 15, including a pressure head and a high temperature heat block disposed adjacent to said cutting and applying mechanism and timed to apply heat and pressure to said strips of tape applied to said lead frames as said lead frames are fed therethrough.

18. The apparatus of claim 16, wherein said pressure head is timed to operate with said cutting and applying head.

19. The apparatus of claim 15, wherein said cutting gate is pivotally supported on said housing and is actuated into and out of position by means of a rack and pinion.

20. The apparatus of claim 17, wherein said lead frames are fed from one reel to another in a continuous strip.

21. The apparatus of claim 19, including first reel means for taking out a strip of paper wound on said first reel of lead frame and a second reel of paper strip for winding onto said second reel of lead frame.

* * * * *